United States Patent [19]

Rougon et al.

[11] 3,923,360

[45] Dec. 2, 1975

[54] MULTILAYER ELECTRICAL CONNECTION PANEL WITH MODIFIABLE INTERNAL CIRCUITS

[75] Inventors: Maurice Pierre Constant Rougon, Bondy; Gerald Albert Edmond Davy, Noisy-e-Roi, both of France

[73] Assignee: Compagnie Honeywell Bull, Paris, France

[22] Filed: Mar. 22, 1974

[21] Appl. No.: 453,901

[30] Foreign Application Priority Data

Mar. 26, 1973 France ............................ 73.10766

[52] U.S. Cl. ............................ 339/17 R; 174/68.5

[51] Int. Cl.² ............................ H05K 1/04

[58] Field of Search .... 339/17 R, 17 B, 18 C, 18 R, 339/17 E

[56] References Cited

UNITED STATES PATENTS

| | | | |
|---|---|---|---|
| 3,148,438 | 4/1964 | Winter et al. | 339/18 A X |
| 3,356,786 | 12/1967 | Helms | 339/18 C X |
| 3,516,156 | 6/1970 | Steranko | 339/17 B X |

OTHER PUBLICATIONS

F. Reinhart, Making Interconnections in Multilayer Boards, IBM Technical Disclosure Bulletin, Vol. 10, No. 12, p. 1985, May 1968.

*Primary Examiner*—Roy Lake
*Assistant Examiner*—E. F. Desmond
*Attorney, Agent, or Firm*—William F. White; Ronald T. Reiling

[57] ABSTRACT

An electrical connection panel is disclosed which comprises two parallel conductive plates with at least one layer of conductors sandwiched therebetween and isolated therefrom by insulative material. Connections between the conductors, the plates, and conductors external to the panel are accomplished by metal-lined holes extending through the panel. The outer surface of one of the conductive planes is provided with a plurality of depressions disposed perpendicular to predetermined sections of sandwiched conductors. The depressions provide a locating and guiding means for a drilling tool which can be inserted into any one of the depressions for drilling through the panel and cutting the corresponding section of sandwiched conductor.

12 Claims, 5 Drawing Figures

MULTILAYER ELECTRICAL CONNECTION PANEL WITH MODIFIABLE INTERNAL CIRCUITS

Figure 1:
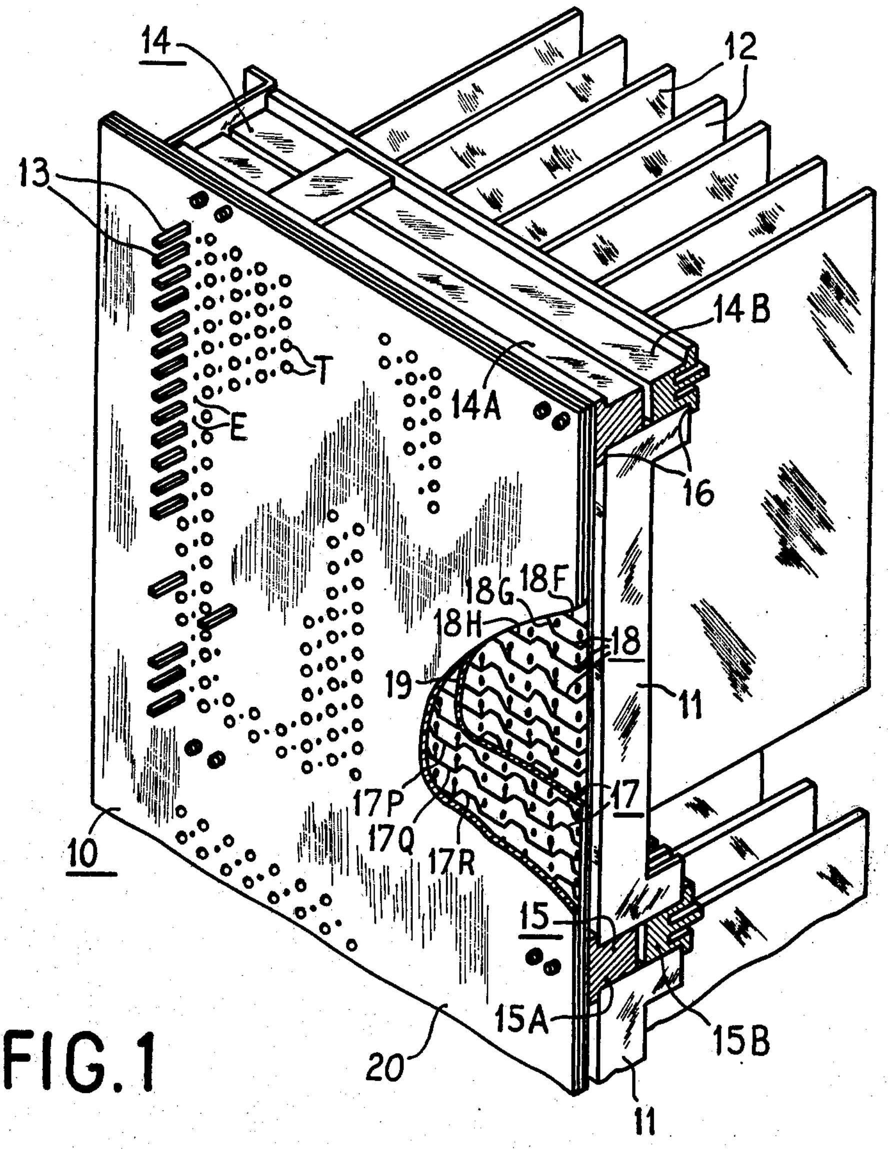

The invention relates to a multilayer electrical connection panel in which the circuitry of the internal layers may easily be altered.

Modern techniques for producing electronic data-processing equipment rely more and more on the use of compact circuits which allow the dimensions of such equipment to be considerably reduced. These compact circuits generally take the form of printed circuits which are sometimes grouped together in several layers in electrical connection panels, as well as on detachable boards which may or may not carry electronic components, these boards being able to be plugged into connectors mounted on the connection panels. In such panels, the electrical links between the various layers of circuitry are generally formed by metal-lined holes running right through the panel, these metal-lined holes also serving as sockets and as connections to which the contacts mounted on the connectors can be soldered.

Connection panels are known in which the printed circuits of any one panel are split up into one or more layers which are separated from one another by layers of an insulating material, the assembly formed by these various layers being sandwiched between two conductive plates, the function of which is to supply, via contact elements connected to these plates, two levels of logic voltage to the electronic circuits carried by the boards plugged into the connectors, the printed circuits sandwiched between the plates on the other hand being used to transmit periodic signals exchanged between these electronic circuits. Such connection panels undergo a pressing operation in the course of manufacture, which is intended to bond the insulating layers to each other and to the other layers and the conductive plates, and they are relatively rigid and do not come apart in use.

In connection panels of this type, the printed circuits which are sandwiched between the two conductive plates in any one panel are particularly well protected against the interference which occurs when conductors which are outside the panel but pass close to it transmit high frequency signals having very steep fronts. Unfortunately however, it is impossible in such connection panels to gain access to the printed circuits sandwiched between the conductive plates and this constitutes a very serious drawback particularly when certain connections formed by the printed circuits have to be broken or altered, either when the piece of equipment in which the panels are incorporated is being set up, or during operations to permit this piece of equipment to be connected to other pieces of equipment (central units and peripheral members) to which it was not connected originally.

The present invention seeks to overcome this drawback and provides a connection panel of the type mentioned above in which the connections formed by the printed circuits inserted between the conductive plates may easily be altered.

The invention provides an electrical connection panel which has two parallel conductive plates and a layer of conductors sandwiched between these plates which is isolated therefrom by means of layers of an insulating material, the connections between the conductors in this layer, the said plates, and connecting members external to the panel being formed by means of metal-lined holes which pass through the panel, these metal-lined holes being arranged in regularly spaced rows and columns, each of the conductors in the said layer extending across a section of the layer situated between two consecutive rows of metal-lined holes, the said connection panel being characterised in that, the outer face of one of the conductive plates is assumed to be divided into elementary areas by the rows and columns of metal-lined holes, each of the areas situated between the columns whose positions are respectively $2n$ and $2n+1$, when $n$ assumes successive whole-number values, is provided with a circular depression arranged perpendicular to the section of conductor situated beneath this area, so as to allow a drilling tool engaged in the depression to be correctly located and guided so as to pierce and cut the said section of conductor when the electrical connection effected by this section is to be broken.

Figure 2:
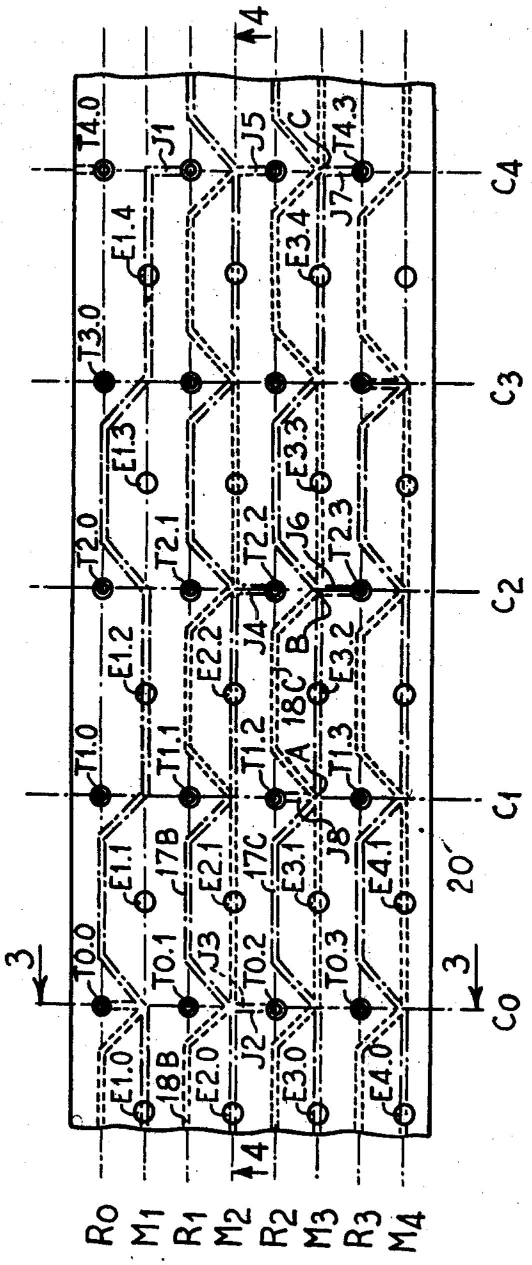
Figure 5:
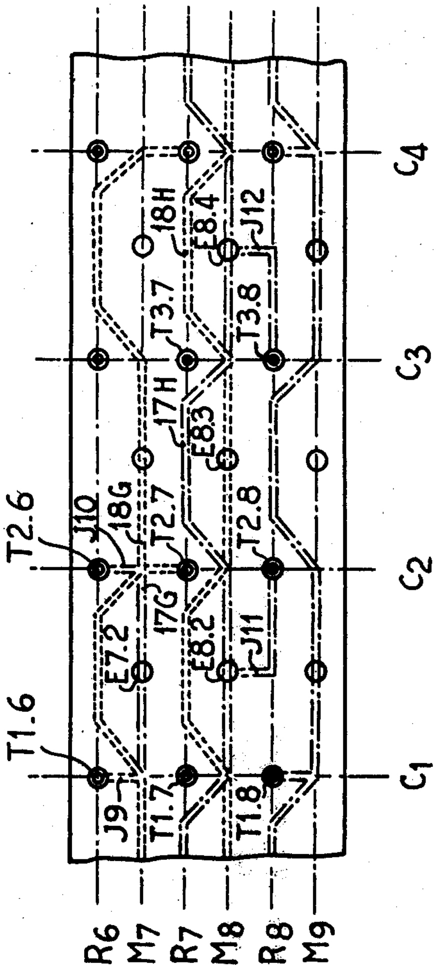
Figure 3:
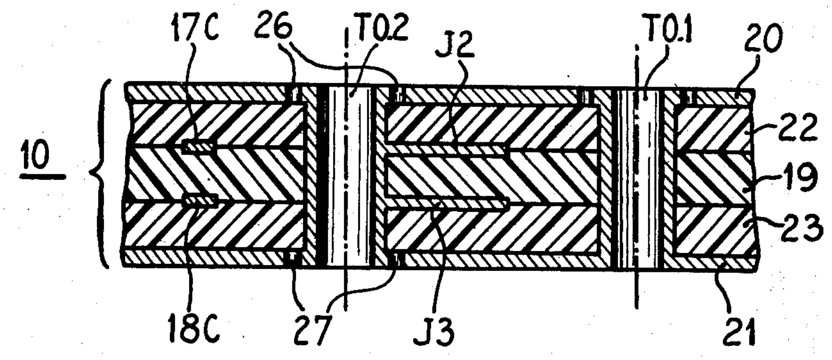
Figure 4:
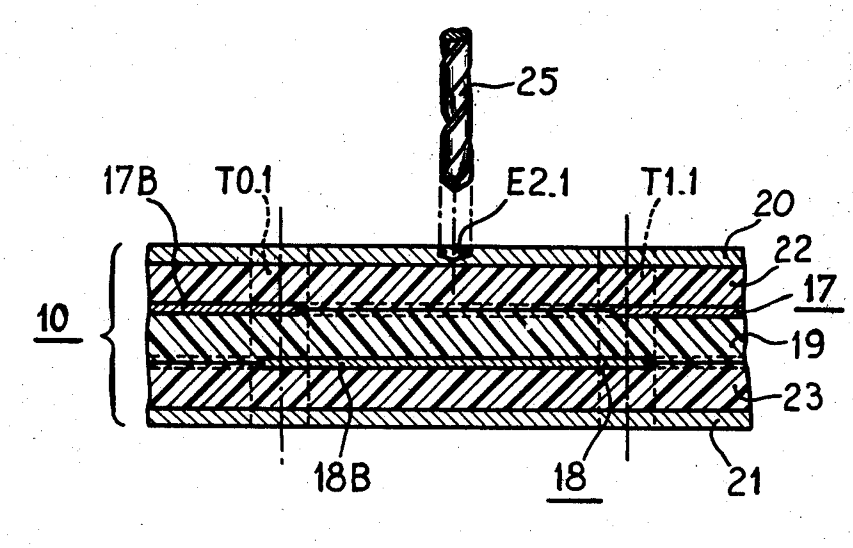

The invention will now be further described, by way of example, with reference to the accompanying drawings, in which:

FIG. 1, is a partly broken-away perspective view of an assembly incorporating a connection panel formed in accordance with the invention, which is provided with connectors for printed-circuit boards, FIG. 2, is a plan view of part of the connection panel of the assembly shown in FIG. 1, FIG. 3, is a sectional view along line 3—3 of FIG. 2, in an area which contains two metal-lined holes which enable the layers to be interconnected, FIG. 4, is a sectional view along line 4—4 of FIG. 2 in an area which contains a circular depression, and FIG. 5, is a plan view of another part of the panel associated with the assembly in FIG. 1, showing a particular arrangement of the conductors sandwiched between the conductive plates.

Basically, the assembly shown in FIG. 1 consists of a connection panel 10 on which are mounted connectors 11 intended to have printed-circuit boards 12 plugged into them. In the example to be described it will be assumed that the connectors are of the type described and shown in French Pat. No. 1,541,094. Without going into detail, it will be mentioned that each of the connectors consists of an insulating body provided with at least one set of aligned seatings, each seating being provided with a contact which is arranged to engage with one of of the contact strips formed on opposite sides of one edge of a printed-circuit board which is inserted in the connector. It is also mentioned that each contact is provided with a shank 13 which is designed to fit into one of the metal-lined holes T in the connecting panel 10.

In the arrangement of FIG. 1, the connectors 11 are disposed in rows, the connectors in each row being arranged side-by-side between two fixing bars such as 14 and 15, which are mounted on the connection panel 10. As FIG. 1 shows, each of the fixing bars is in two parts. Thus, bar 14 is formed from two parts, 14A and 14B, and bar 15 is made up in a similar way of two parts, 15A and 15B. The two parts of each bar are both provided with flanges 16 which are formed in such a way as to be capable of gripping the ends of connectors positioned between two opposing flanges.

As can be seen in FIGS. 1 and 2, the metal-lined holes T in the connection panel 10 are lined up so that they form rows and columns, the rows being referenced $R_0$, $R_1$, $R_2$, etc in FIG. 2 and the columns being referenced $C_0$, $C_1$, $C_2$, etc in the same Figure. For reasons which will become apparent later in the description, the metal-lined holes in FIG. 2 have been designated by the reference T followed by two numbers separated by a dot, the first of these two numbers giving the position of the column in which each metal-lined hole is situated and the second number giving the position of the row in which the hole in question is situated. As an example, metal-lined hole T1.3 is situated at the intersection between column $C_1$ and row $R_3$. Also shown in FIG. 2 are the central axes M or the rows of metal-lined holes, these central axes being referred to in this Figure by references $M_1$, $M_2$, $M_3$ etc. Thus, as an example, central axis $M_1$ is situated at the same distance from rows $R_0$ and $R_1$.

FIG. 3, which is a cross-section, along column $C_0$, of part of the connection panel shown in FIG. 2 in an area which contains metal-lined holes T0.1 and T0.2, is intended to show how this panel is made up. The make-up of the panel also appears in FIG. 1 where the broken-away portions allow certain details of construction to be seen, as well as in FIG. 4, which is a sectional view along the axis M2 central to the rows $R_1$ and $R_2$ of metal-lined holes of the part of the panel which is shown in FIG. 2. It can be seen (FIG. 1) that the connection panel 10 contains two layers 17 and 18 of printed conductors, with layer 17 consisting of a plurality of conductors each designated by the reference 17 followed by a letter, such as 17P, 17Q, 17R etc, and with layer 18 similarly consisting of a plurality of conductors each of which carries a reference 18 followed by a letter, such as 18F, 18G, 18H, etc. As may be seen with reference to FIGS. 3 and 4, the two layers 17 and 18 of conductors are separated frm one another by a layer 19 of an insulating material. FIG. 3 and 4 also show that the connection panel 10 further has two parallel conductive plates 20 and 21 arranged on either side of the assembly formed by layers 17, 18 and 19, the plates being separated from this assembly by means of one or other of the two layers of insulating material 22 and 23.

In a simplified embodiment of the connection panel 10, the panel may contain only a single layer of conductors, such as conductor layer 17, this layer being then sandwiched between the conductive plates 20 and 21 and being isolated from them by layers 22 and 23.

The metal-lined holes, which pass right through the connection panel, allow either certain of the conductors in different layers to be connected together electrically or these conductors or the conductive plates 20 and 21 to be connected to connectors external to the panel. In the embodiment shown in FIG. 1, these external connectors are formed by contacts, the shanks 13 of which are each inserted into one of the metal-lined holes in the panel, each shank being connected in a known way to the metal-lined hole into which it fits by soldering. When no connection is to be made between conductive plates 20 and 21 and certain shanks, the metal-lined holes in which the shanks are engaged are then isolated from the plates by means of a cutting or engraving operation which is carried out on the plates around each of the holes in question before the fixing bars and connectors are fitted to the connection panel. Thus, in FIG. 3, metal-lined hole TO.2 is isolated from plates 20 and 21 by cuts made in the plates at 26 and 27 respectively, and connects together two conductors in layers 17 and 18, while metal-lined hole TO.1 is connected only to conductive plate 21.

In the example described, conductive plates 20 and 21 are normally connected to a voltage source (not shown) in order to supply two logic voltages (e.g. + 5 volts and 0 volts) to the various electronic circuits carried on the printed-circuit boards engaged in the connectors, via contacts connected to the plates. The conductors in layers 17 and 18 are used on the other hand to transmit the electrical signals and pulses received or emitted by various electronic circuits. As can be seen from FIGS. 1 and 2, each of the conductors extends substantially in the same direction as the rows of metal-lined holes, each conductor, as it extends across the layer of conductors to which it belongs, being confined to an area of the layer situated between two consecutive rows of metal-lined holes. Thus, in FIG. 2 conductor 17C, for example, is confined to an area situated between rows $R_2$ and $R_3$ of metal-lined holes. In the example described, the shape and mutual relationship of the conductors in layers 17 and 18 is similar to that described and shown in Patent application No. 72 46681 which was filed in France by the present Applicants on Dec. 28, 1972 under the title "An electrical connection panel". In exactly the same way as in the connecting panel described in that appliction, each of the conductors in layers 17 and 18 is in the form of a broken line, certain portions of which coincide with the axis central to the two rows of metal lined holes between which the conductor in question extends. In the case of the conductors in layer 17, these portions are those which are situated between the columns of metal-lined holes the positions of which are respectively $(2n + 1)$ and $(2n + 2)$, that is to say those which are situated between columns $C_1$ and $C_2$, $C_3$ and $C_4$ etc, whereas, in the case of the conductors in layer 18, these portions are those which are situated between the columns of metal-lined holes the positions of which are respectively $2n$ and $(2n + 1)$. Thus, in FIG. 2, the path followed by conductor 18B, for example, coincides with the sections of the central axis $M_2$ situated between columns $C_0$ and $C_1$ (where $n = 0$), between columns $C_2$ and $C_3$ (where $n = 1$), etc, that is to say, in general terms, those sections which are situated between the columns for which the general references are respectively $C_{2n}$ and $C_{2n+1}$. It should however be mentioned that, although the effect of this arrangement is to supress cross-talk between the conductors in layers 17 and 18, it is not absolutely essential to the present invention, particularly where the connection panel 10 contains only a single layer of conductors sandwiched between conductive plates 20 and 21, and that each of the conductors in this layer (or layers) could be of any configuration whatever, provided only that in the course of its progress across the layer of conductors of which it is part, it remains confined between two consecutive rows of metal-lined holes.

In FIG. 2 it may also be noted that in the embodiment described, none of the conductors in layer 17 or layer 18 passes through a metal-lined hole along its path. However, any connections required between these conductors and certain metal-lined holes in the connection panel are formed by means of junction conductors which, in FIG. 2, have been given the reference letter J followed by a number. Thus, metal-lined holes T2.2 is linked to conductor 17B by junction conductor J4. Similarly, metal-lined hole T0.2 is linked to conductor 17B by junction conductor J2 and to conductor 18B by conjunction conductor J3, these two junction conductors lying one above the other as shown in FIG. 3. It should however be pointed out that in another embodiment of the connection panel, the conductors in the various layers could, without difficulty, pass through certain metal-lined holes in the panel and in this case the junction conductor would be dispensed with.

If reference is now made to FIGS. 1 and 2, it can be seen that the outer face of conductive plate 20 of the connection panel is provided with circular depressions, which are in FIG. 1 are referred to by the general reference E and which, so that they may be differentiated, are designated in FIG. 2 by the reference letter E followed by the two numbers the meaning of which will be explained below. It is assumed, so that the description is easy to understand, that the outer face of plate 20 is divided into units of area by the rows and columns of metal-lined holes, it can be seen from FIG. 2 that each depression is situated within an area which is defined on the one hand by two consecutive rows of metal-lined holes and on the other hand by two consecutive columns of such holes. It can also be seen from FIG. 2 that in accordance with the invention, each of the depressions is arranged perpendicularly above a section of a conductor situated beneath the unit area in which the depression is located. Although in the case shown in FIG. 2 the connection panel has two layers of conductors and therefore each area has situated beneath it two sections of conductor belonging to two different layers, it should be borne in mind that, where the connection panel contains only a single layer of conductors sandwiched between plates 20 and 21, each unit of area will then cover only a single section of conductor. It should be mentioned that in the latter case the depressions which conductive plate 20 contains are made only in the unit areas situated between the columns of metal-lined holes whose respective positions are $2n$ and $2n + 1$, with $n$ assuming successive whole-number values, that is to say in the areas which are situated between columns $C_0$ and $C_1$ ($n = 0$), $C_2$ and $C_3$ ($n = 1$), $C_4$ and $C_5$ ($n = 2$), etc.

In the embodiment shown in FIG. 2, the elementary or unit areas which are situated between the columns whose respective positions are $2n$ and $2n + 1$ with $n$ assuming the successive values 0, 1, 2, 3, 4 etc, each contain a depression arranged perpendicularly above a section of conductor in layer 18, whereas the elementary areas situated between the columns of metal-lined holes whose respective positions are $2n + 1$ and $2n + 2$ with $n$ assuming successive whole-number values, each contain a depression situated perpendicularly above a section of conductor in layer 17. For example, depression E2.1, which is situated in the unit area between rows $R_1$ and $R_2$ and between columns $C_0$ and $C_1$, is arranged, as shown in FIG. 2, perpendicular to the section of conductor 18B which lies between the two columns. Similarly, depression E3.2, which is situated in the unit area lying between rows $R_2$ and $R_3$ and between columns $C_1$ and $C_2$, is arranged perpendicular to the section of conductor 17C which lies between columns $C_1$ and $C_2$.

It should also be pointed out that, where the connecting panel contains two layers of conductors sandwiched between plates 20 and 21, the depressions are made in such a way that they are never situated perpendicular to two sections of conductor belonging to different layers at the same time. This being so, it is possible to ensure that only a single section of conductor runs under each depression. The result is that, if certain connections formed between the conductors in layers 17 and 18 and the metal-lined holes have to be broken either during the operation of preparing the piece of equipment in which the panel is incorporated, or when altering wiring so as to allow the piece of equipment in question to carry out functions different from those for which it was originally designed, it is merely necessary to insert a drilling tool successively into each of the depressions arranged perpendicular to the sections of conductor which need to be cut and thus to drill into the connecting panel until these sections are cut by the drilling tool. By way of example, FIG. 4 shows the position of the drilling tool, which is formed in this case by a drill 25, before it enters one of the depressions in the connection panel, which may be depression E2.1 for example, so as to drill into the panel and thus cut the section of conductor situated beneath this depression, that is to say, in the present case, the section of conductor 18B which is situated between the columns $C_0$ and $C_1$ of metal-lined holes. it will thus be appreciated that drill 25, which is engaged in the depression before it starts drilling, will obviously be correctly positioned relative to the section of conductor which is to cut and that, since the depression provides a precise guide for it at the beginning of the drilling operation, there is no danger of it cutting only part of the conductor when it comes into contact with it. Nevertheless, so that the conductor will be cut cleanly, it is necessary for the drill to be of a sufficiently large diameter in comparison with the width of the conductor. In the example described where the width of the conductors is of the order of 0.6mm, this condition is met if a drill is used having a diameter of at least 0.8 mm, the thickness of the connection panel being approximately 2.5 mm. In addition, it was found that correct guidance was provided in practice for the drill to allow it to cut any one of the conductors when the diameter of the depressions in which the drill was engaged before the drilling operation was between substantially 0.4 times the diameter of the drill and a diameter equal to that of the drill. In the example described, this condition is met by reason of the fact that the diameter of the depressions is substantially equal to 0.5 mm. It will thus be appreciated that the depressions with which the conductive plate 20 is provided not only enable the operator to locate accurately the points at which he may drill to cut the conductors sandwiched between the two plates 20 and 21 but also prevent the drill slipping across plate 20 at the beginning of the drilling operation. Because the drill is held in the correct position relative to the conductor which it is to cut in this way, it cannot fail in the course of its penetration to cut the conductor cleanly.

Returning now to FIG. 2, if it is desired to isolate metal-lined hole T2.3, for example, from the conductor 17C to which it is connected by linking conductor J6, it is merely necessary to drill through conductor 17C at points situated perpendicular to depressions E3.2 and E3.4. However, the effect of this operation is also to break the connection which until then had been provided by conductor 17C between metal-lined holes T1.2 and T4.3. This connection may, however, easily be restored by using a conductor external to the connection panel and soldering the ends of this conductor to the respective shanks of the contacts plugged into metal-lined holes T1.2 and T4.3 or simply by winding the lead around these shanks.

To make it possible for each of the metal-lined holes in the connection panel to be isolated in this way, it is necessary in the case of each conductor which extends between two consecutive rows of metal-lined holes for there to be at least one depression above each of the sections of this conductor which lie between the points at which the conductor is joined by junction conductors which connect it to the metal-lined holes in the said two rows. Thus, in FIG. 2, above the section of conductor 17C which is situated between the points A and B at which this conductor is joined by junction conductors J8 and J6, there is situated a depression E3.2. Similarly, above the section of conductor 17C which is situated between the points B and C at which the conductor is joined by junction conductors J6 and J7, is situated a depression E3.4. In order that the conditions necessary to enable a metal-lined hole in the connection panel to be isolated always exist, whatever the configuration of the conductors which extend between the rows of metal-lined holes, it may sometimes be necessary to arrange the junction conductors in a different way from those in the example described which broadly speaking lie along the columns of metal-lined holes. This is the case, for example, in the embodiment shown in FIG. 5, in which the junction conductors J11 and J12, which connect metal-lined holes T2.8 and T3.8 respectively to conductor 17H are arranged not so that they lie along the columns C2 and C3 in which these metal-line holes are situated, but so that they meet conductor 17H at points situated perpendicular to depressions E8.2 and E8.4.

It can also be seen from FIGS. 2 and 5 that, in the example described, each of the depressions with which the conductor plate is provided is located at the centre of its respective elementary area. Thus, depression E2.1 in FIG. 2 is situated at the centre of the elementary area defined by columns $C_0$ and $C_1$ and by rows $R_1$ and $R_2$. To make it easier to find the depressions, each of them has been given a reference letter E followed by two numbers separated by a dot, the first of the numbers corresponding to the position of the central axis on which the depression is situated and the second corresponding to the position of the column which in the drawing, is situated immediately to the right of the said depression. Because of the fact that, in the example described, the depressions are all arranged in regularly spaced rows and columns, these two numbers perform the function of an address, which then enables an operator who has been instructed to make modifications to the circuits in the connection panel to find the position of depressions in the panel quickly and with hardly any likelihood of making a mistake. In addition, where the contact shanks plugged into the metal-lined holes in the connection panel are relatively close to one another and are a considerable hindrance when the drilling tool is brought to bear, the position of each depression at the centre of its respective elementary area makes it easier for the operator to drill into the panel so as to cut the conductors in layers 17 and 18.

We claim:

1. An electrical connection panel comprising two parallel conductive plates and a layer of conductors which is sandwiched between these plates and isolated from them by means of layers of an insulating material, the connections between the conductors of this layer, the said plates, and connectors external to the panel being produced by means of metal-lined holes extending through the panel, these metal-lined holes being arranged in regularly spaced rows and columns, each of the conductors in the said layer extending across a section of the layer situated between two consecutive rows of metal-lined holes, the said connection panel being characterised in that, the outer face of one of the conductive plates is assumed to be divided into elementary areas by the rows and columns of metal-lined holes, each of the areas situated between the columns the respective positions of which are $2n$ and $2n + 1$, when $n$ assumes successive whole-number values, is provided with a circular depression arranged perpendicular to the section of conductor situated beneath this area in order to enable a drilling tool engaged in the depression to be correctly located and guided so as to drill through and cut the said section of conductor when the electrical connection provided by this section is to be broken.

2. A connection panel according to claim 1, characterised in that, when the conductors in the layer do not pass through the metal-lined holes in the panel, the panel contains junction connectors sandwiched between the conductive plates which are arranged parallel to the said plates and which connect each of the conductors in the layer to at least two metal-lined holes belonging to two consecutive rows between which the conductor extends, the points of intersection between any one conductor in the layer and the junction connectors to which it is linked being so defined that the sections of the said conductor which lie between these points each pass under at least one depression in the connection panel.

3. A connection panel according to claim 1, characterised in that the path of each conductor in the layer which extends between two consecutive rows of metal-lined holes coincides with the axis central to these two rows when passing beneath each of the elementary areas provided with a depression, and is at a distance from the said axis when passing beneath each of the other elementary areas.

4. A connection panel according to claim 3, characterised in that, in each elementary area provided with a depression, the depression is located at the centre of the elementary area.

5. A connection panel according to claim 1, characterised in that it further contains a second layer of conductors separate from the first which is sandwiched between the two conductive plates, each of the conductors in the second layer extending across a section of the said layer situated between two consecutive rows of metal-lined holes, and in that, on the outer face of the conductive plate provided with depressions, each of the elementary areas situated between the columns of metal-lined holes the respective positions of which are $2n + 1$ and $2n + 2$, when $n$ assumes successive whole-number values, is likewise provided with a circular depression situated perpendicular to the section of conductor in the second layer which passes beneath this area, so as to enable a drilling tool engaged in this depression to be in the correct position to drill through and cut this section of conductor when the electrical connection provided by the latter is to be broken.

6. A connection panel according to claim 5, characterised in that each conductor in the second layer follows a path which, when it passes under each of the elementary areas situated between the columns of metal-lined holes the respective positions of which are $2n$ and $2n + 1$, coincides with the axis central to the two rows of holes between which it extends, and which, when it passes beneath each of the other areas is at a distance from this axis, and in that the path followed by each conductor in the second layer coincides with the axis central to the two rows of holes between which it extends beneath each of the elementary areas situated between the columns the respective positions of which are 2$n$ + 1 and 2$n$ + 2, and is at a distance from this axis beneath each of the other areas.

7. An electrical connection panel comprising two parallel conductive plates and at least one layer of conductors sandwiched between said plates and isolated from them by means of layers of an insulating material, wherein the connections between the conductors, the said plates, and conductors external to the panel are produced by means of metal-lined holes extending through the panel and wherein the outer surface of one of the conductive plates is provided with a plurality of depressions respectively disposed perpendicular to predetermined sections of the said conductors, said depressions being provided for the purpose of locating and guiding a drilling tool which when inserted in any one of the depressions, can drill through the panel and cut the corresponding section of said conductor when it is desired that a conductor shall be broken at this point.

8. An electrical connection panel as claimed in claim 7, wherein the metal-lined holes are arranged in regularly spaced rows and columns which serve to define contiguous elementary areas of said outer surface of said conductive plate and wherein conductor sections extend across at least some of said areas and a depression is provided in each of those said areas perpendicular to the associated conductor section where it may be desired to cut said conductor section by a drilling operation.

9. An electrical connection panel as claimed in claim 8, wherein the conductors consist of a plurality of connected sections and alternate sections extend along the central axis of the areas between two rows of said holes, whilst the other sections are spaced away from said central axis and the depressions are located on said central axis perpendicular to the conductor sections also located on said axis.

10. An electrical connection panel as claimed in claim 9, wherein two separate layers of conductors are provided and the alternate conductor sections of the second layer which extend along said central axis are located in those areas where the conductor sections of the first layer are spaced away from said central axis and wherein a depression is provided in each of said areas.

11. An electrical connection panel as claimed in claim 8, wherein the corners of each of said elementary area is defined by a metal-lined hole and a depression is provided in the centre of each area.

12. An electrical connection panel as claimed in claim 7, wherein at least some of the conductors are spaced from the metal-lined holes and junction conductors extend between at least some of said holes and sections of said conductors.

* * * * *